United States Patent [19]

Yero

[11] Patent Number: 5,412,602
[45] Date of Patent: May 2, 1995

[54] DEVICE FOR GENERATING A VOLTAGE FOR PROGRAMMING A PROGRAMMABLE PERMANENT MEMORY, ESPECIALLY OF EPROM TYPE, METHOD AND MEMORY RELATING THERETO

[75] Inventor: Emilio Yero, Aix-En-Provence, France

[73] Assignee: SGS-Thomson Microelectronics S.A., Gentilly, France

[21] Appl. No.: 75,563

[22] PCT Filed: Oct. 14, 1992

[86] PCT No.: PCT/FR92/00967
§ 371 Date: Nov. 3, 1993
§ 102(e) Date: Nov. 3, 1993

[87] PCT Pub. No.: WO93/08573
PCT Pub. Date: Apr. 29, 1993

[30] Foreign Application Priority Data

Oct. 18, 1991 [FR] France .................... 91 12888

[51] Int. Cl.⁶ ............................................. G11C 13/00
[52] U.S. Cl. ........................ 365/189.01; 365/230.01; 365/226
[58] Field of Search ............. 365/226, 189.01, 230.01, 365/189.09, 230.08

[56] References Cited

FOREIGN PATENT DOCUMENTS

| | | |
|---|---|---|
| 0222173A1 | 5/1987 | European Pat. Off. . |
| 0276696A2 | 8/1988 | European Pat. Off. . |
| 0352111 | 1/1990 | European Pat. Off. . |
| 2041193 | 8/1980 | United Kingdom . |

OTHER PUBLICATIONS

Microprocessors and Microsystems, vol. 14, No. 8, Oct. 1990, London, GB, pp. 543–549, Zales S. et al, "Intel Flash EPROM for In-System Reprogrammable Non-volatile Storage".

IEEE Journal of Solid-State Circuits, vol. SC-22, No. 4, Aug. 1987, New York, US, pp. 548–552, Masouka F. et al, "A 256-Kbit Flash EEPROM Using Triple-Polysilicon Technology".

*Primary Examiner*—Terrell W. Fears
*Attorney, Agent, or Firm*—Wolf, Greenfield & Sacks

[57] ABSTRACT

A device for generating a voltage for programming a programmable permanent memory, especially of EPROM type, from an external DC voltage source, the device including a circuit for generating a reference voltage, a circuit for duplicating the reference voltage which is arranged as a current and voltage mirror and which outputs a programing voltage as its output, and a follower MOS transistor whose drain and source are connected respectively to the external DC voltage source and to the output of the duplicating means and whose gate is connected to a predetermined internal node of the circuit for generating a reference voltage.

15 Claims, 2 Drawing Sheets

DEVICE FOR GENERATING A VOLTAGE FOR PROGRAMMING A PROGRAMMABLE PERMANENT MEMORY, ESPECIALLY OF EPROM TYPE, METHOD AND MEMORY RELATING THERETO

BACKGROUND OF THE INVENTION

1. Field of the Invention

The present invention relates to a device for generating a voltage for programming a programmable permanent memory, especially a memory of EPROM type.

It also concerns a method implemented in this device as well as a memory incorporating this device.

2. Discussion of the Related Art

During operations for programming programmable memories, especially of EPROM type, the voltage generators with which these memories are endowed must deliver, from an external applied voltage, a stabilized programming voltage to memory cells which represent an equivalent load of substantially variable impedance. Now, present-day generating devices generally have too high an output impedance to contribute to limiting to reasonable levels the programming voltage variations induced by the constraints inherent in manufacture.

Now, excessive voltage variations give rise to constraints on the components which may lead to their degradation and destruction.

An object of the present invention is to remedy these disadvantages by providing a device for generating a voltage for programming a programmable permanent memory, especially of EPROM type, from an external DC voltage source, comprising means for generating a reference voltage.

SUMMARY OF THE INVENTION

According to the invention, this device comprises means for duplicating said reference voltage, arranged as a current and voltage mirror structure and generating the programming voltage as output, and a follower MOS transistor whose drain and source are connected respectively to the external DC voltage source and to the output of said duplicating means and whose gate is connected to a predetermined internal node of said means for generating a reference voltage.

Thus, with the device according to the invention, there is available a programming voltage delivered by a generator having an output impedance which is considerably reduced with respect to the prior-art devices through recourse to duplicating means employing a mirror structure. A negative feedback loop produced by the link between the gate of the follower transistor and the reference generating means, furthermore contributes to stabilizing the programming voltage. In practice, this loop has a high negative gain with respect to the variations in the output voltage. This affords self-adaptation of the device according to the invention to variable conditions of load current.

According to an advantageous version of the invention, the means for generating a reference voltage comprise a first MOS transistor whose source is connected to the external DC voltage source and a second MOS transistor whose drain is connected to earth, a first, a second and a third resistive element connected in series between the external DC voltage source and earth, the gate of the first MOS transistor being connected to a junction node between the first and second resistive elements whilst the gate of the second MOS transistor is connected to a junction node between the second and third resistive elements, and the duplicating means comprise a first mirror MOS transistor whose drain and source are connected respectively to the drain of the first MOS transistor and to the source of the second MOS transistor of said means for generating a reference voltage.

According to a preferred embodiment of the invention, the duplicating means furthermore comprise a second mirror MOS transistor whose gate is connected to the gate of the first mirror MOS transistor and whose source constitutes the output of said duplicating means, and a third mirror MOS transistor whose gate, source and drain are connected respectively to the gate of the first MOS transistor of the generating means, to the external DC voltage source and to the drain of the second mirror MOS transistor.

According to another aspect of the invention, the method of generating a voltage for programming a programmable permanent memory, especially of EPROM type, from an external DC voltage source, comprises a first step for generating a reference voltage from a voltage delivered by said external DC voltage source, implemented in the device according to the invention, a second step for duplicating said reference voltage and generating said programming voltage, and a third step for stabilizing said programming voltage.

According to a preferred form of implementation of the method according to the invention, the third stabilizing step includes a feedback step in which the programming voltage is slaved to said reference voltage.

Moreover, the duplicating step includes a reference voltage and current mirror operation.

The device according to the invention can be incorporated into programmable permanent memories, especially of EPROM type, in which the method according to the invention can also be implemented.

BRIEF DESCRIPTION OF THE DRAWINGS

Other features and advantages of the invention will emerge further in the description below. In the drawings attached by way of non-limiting examples.

DETAILED DESCRIPTION

Figure 1:
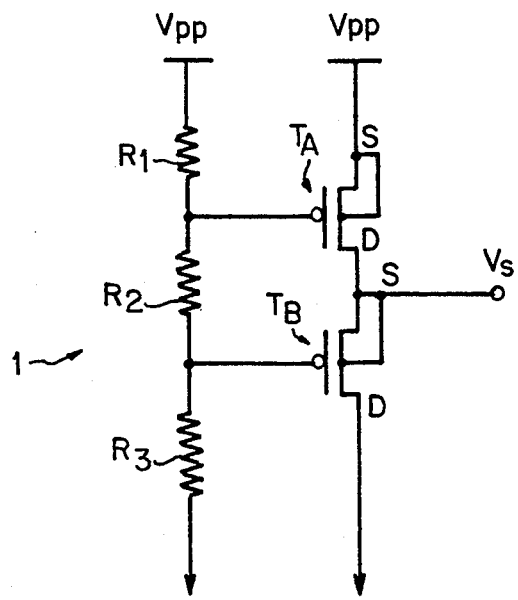
FIG. 1 is a diagram of a generator device representative of the prior art.

A practical embodiment of the invention will now be described in connection with FIGS. 1 to 3.

Figure 2:
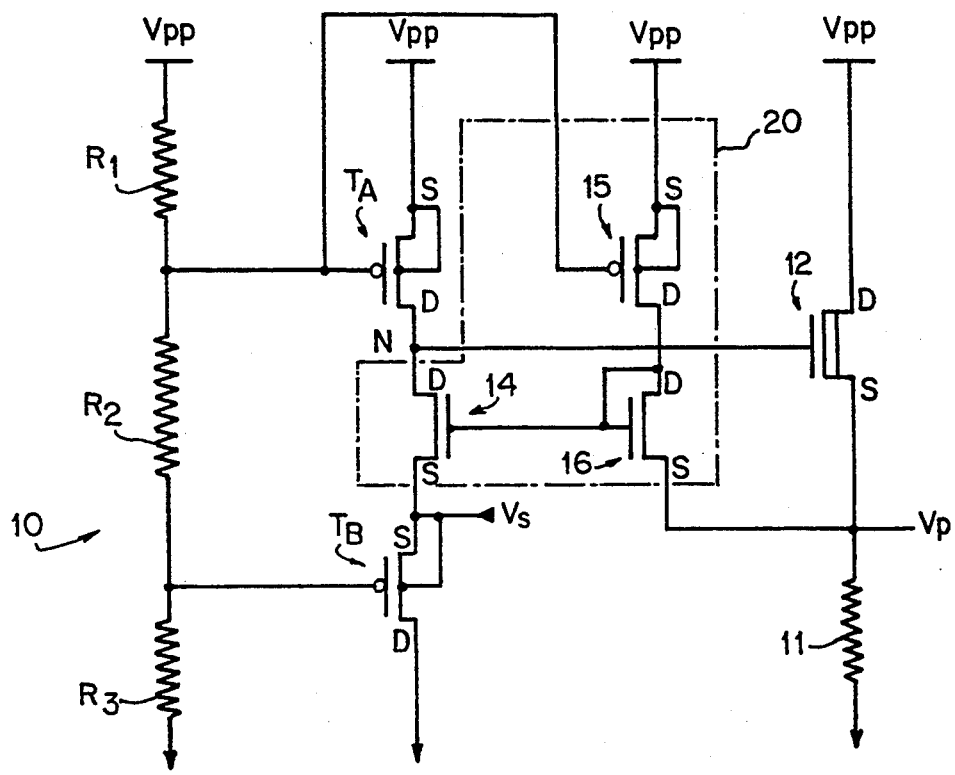
FIG. 2 is a diagram of an embodiment of a generator device according to the present invention.
Figure 3:
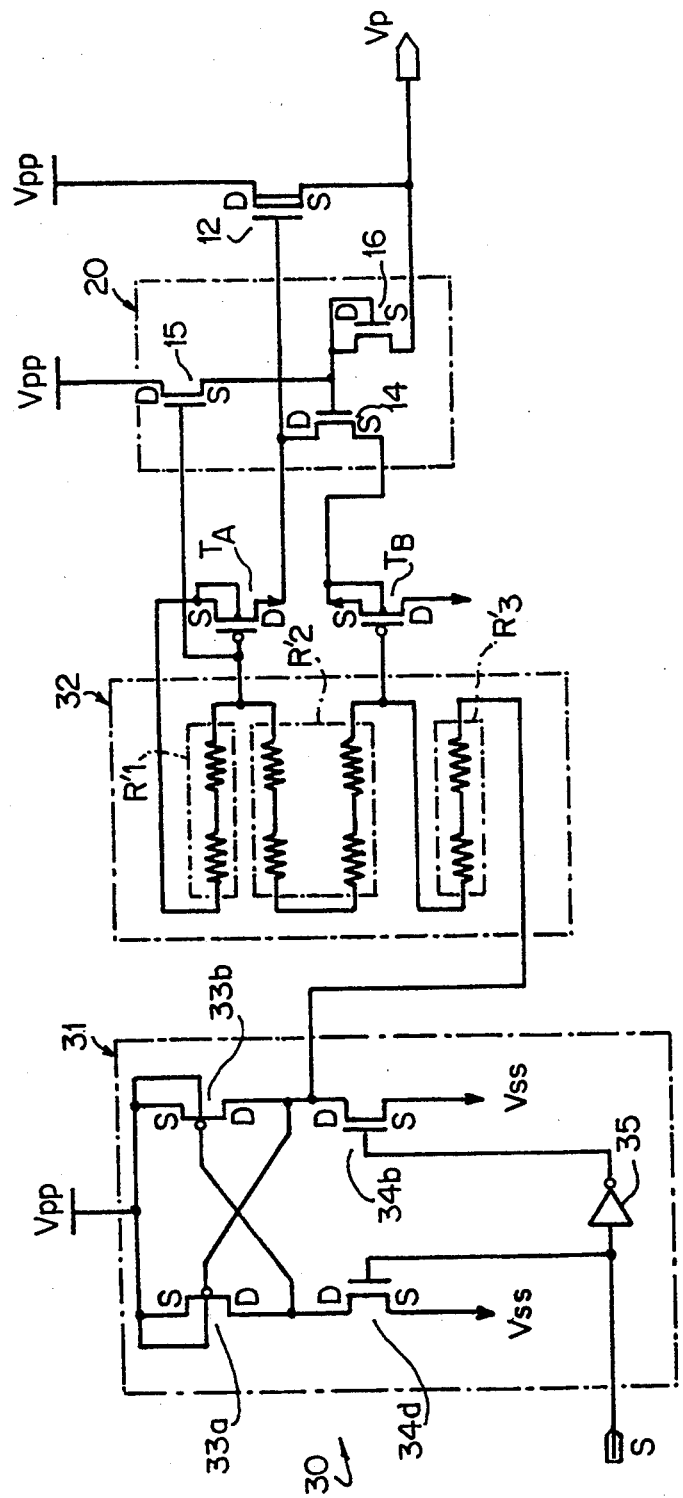
FIG. 3 is a diagram of another embodiment of a generator device according to the invention.

The device 10 according to the invention comprises, in connection with FIG. 2, a first stage generating a reference voltage from a DC voltage Vpp delivered by an external DC voltage source (not shown). This first stage corresponds to the generator setup 1 represented in FIG. 1 and already known in the prior art. Such a circuit 1 comprises a first, a second and a third resistive element R1, R2, R3 connected in series between a point at the potential of the external DC voltage source Vpp and the earth, a first MOS transistor TA whose source is placed at the potential Vpp and a second MOS transistor TB whose drain is connected to earth and whose source is connected to a drain of the first MOS transistor TA. A gate of the first transistor TA is connected to a junction node between the first R1 and second R2 resistive elements, whilst the gate of the second MOS transistor TB is connected to a junction node between the second R2 and third R3 resistive elements.

In one embodiment of the present invention, the first and second MOS transistors TA, TB are p-channel transistors produced by implantation and whose substrate is connected to the source so as to minimize the threshold voltages.

It is readily shown that the circuit 1 generates an output voltage Vs substantially equal to Vpp * (R1+R3)/(R1+R2+R3), which is independent of the manufacturing parameters of the circuit as long as the two transistors TA, TB remain saturated. The output voltage from the circuit 1 is henceforth regarded as reference voltage.

Referring now to FIG. 2, a duplicating circuit 20 is placed downstream of the generator circuit, its purpose being to duplicate the reference voltage without creating an internal load for the generator. The sensitivity of the output voltage to possible variations in load current can thus be reduced.

The duplicating circuit 20, which implements the current and voltage mirror concept, known in electronics, comprises a first mirror MOS transistor 14 inserted between the two first and second MOS transistors TA, TB of the reference voltage generator, a second mirror MOS transistor 16 whose gate is connected to the gate of the first mirror MOS transistor 14 and whose source is at the potential of the output voltage Vp, and a third mirror MOS transistor 15 whose source is at the potential Vpp, the gate being connected to the gate of the first MOS transistor TA and the drain being connected to the drain of the second mirror MOS transistor 16. The drain and the source of the first mirror MOS transistor 14 are connected respectively to the drain of the first MOS transistor TA and to the source of the second MOS transistor TB.

In one embodiment of the present invention, the first and second mirror MOS transistors 14, 16 are transistors produced by n-channel implantation whilst the third mirror MOS transistor 15 is a transistor produced by p-channel implantation. Also, the second and third mirror MOS transistors 15, 16 have their respective substrates connected respectively to their source and to their drain so as to minimize their threshold voltage.

The device 10 according to the invention comprises an n-channel native follower MOS transistor 12 whose drain and source are connected respectively to the potential Vpp of the external DC voltage source and to the load supplied by the device according to the invention and represented diagrammatically by an impedance 11. This load is subjected to the stabilized potential difference Vp. The gate of the follower transistor 12 is connected at a predetermined point N to the source of the first MOS transistor TA of the reference voltage generator. The link at this point N provides for the closing of a negative feedback loop for the programming voltage Vp, which has been shown to be remarkably stable by a numerical simulation.

By way of example, in an efficacious embodiment of the device according to the invention, there are obtained by computer simulation an output resistance of the generator equal to 2.7 ohms and a variation in the programming voltage equal to just 81 mV for a typical variation in load current from 0 to 30 mA.

The generator device according to the invention can of course be associated with other circuits placed upstream or downstream. By way of example, and in connection with FIG. 3, there may be provision, within a generator device 30, for the addition upstream of a circuit 31 for monitoring the supply voltage delivered to the reference voltage generator. This supervising circuit 31 can for example comprise a symmetrical set up of two MOS transistor arms 33a, 34a; 33b, 34b, each arm comprising a first n-channel MOS transistor controlled respectively by a control signal S and by its logic inverse generated by an inverting logic port 35, and a second p-channel MOS transistor whose gate is connected to the drain of the corresponding transistor of the other arm, these two latter transistors each having their substrate connected to their source.

The junction point of the two transistors 33b, 34b of the second arm of the monitoring circuit 31 is connected to a first end of a network 32 of resistors R'1, R'2, R'3 implanted in the substrate of the circuit and constituting the three resistors required by the reference voltage generator described previously. The remaining part of the generator device 30 which includes the duplicating stage and the follower transistor is identical to the setup of FIG. 2 described previously.

Of course, the invention is not limited to the examples which have just been described and many other contrivances and applications may be imagined without departing from the scope of the invention.

Thus, various embodiments of the resistive elements included in the reference voltage generator may be envisaged. Moreover, the device according to the invention can be associated with other circuits for shaping or for protection as a function of the constrains specific to the host memory and to its conditions of use.

What is claimed is:

1. A device for generating a voltage for programming a programmable permanent memory, especially of EPROM type, from an external DC voltage source, comprising means for generating a reference voltage, which furthermore comprises means for duplicating said reference voltage, arranged as a current and voltage mirror structure and generating the programming voltage as output, and a follower MOS transistor whose drain and source are connected respectively to the external DC voltage source and to the output of said duplicating means and whose gate is connected to a predetermined internal node of said means for generating a reference voltage.

2. The device as claimed in claim 1, wherein the means for generating a reference voltage comprises:
   a first MOS transistor whose source is connected to the external DC voltage source and a second MOS transistor whose drain is connected to earth;
   a first, a second and a third resistive element connected in series between the external DC voltage source and earth, a gate of the first MOS transistor being connected to a junction node between the first and second resistive elements whilst a gate of the second MOS transistor is connected to a junction node between the second and third resistive elements; and
   wherein the duplicating means comprise a first mirror MOS transistor whose drain and source are connected respectively to a drain of the first MOS transistor and to a source of the second MOS transistor of said means for generating a reference voltage.

3. The device as claimed in claim 2, wherein the duplicating means further comprises:

a second mirror MOS transistor whose gate is connected to a gate of the first mirror MOS transistor and whose source constitutes the output of said duplicating means, and a third mirror MOS transistor whose gate, source and drain are connected respectively to the gate of the first MOS transistor of the generating means, to the external DC voltage source and to the drain of the second mirror MOS transistor.

4. The device as claimed in claim 2, wherein the gate of the follower MOS transistor is connected to the drain of the first MOS transistor of the generating means.

5. The device as claimed in claim 2, wherein the first and second MOS transistors are p-channel implanted MOS transistors and each transistor substrate is connected to its source.

6. The device as claimed in claim 3, wherein the first and second mirror MOS transistors are n-channel implanted MOS transistors, the third mirror MOS transistor is a p-channel implanted MOS transistor, and wherein said second and third mirror MOS transistors respectively have their drain and their source connected respectively to their gate and to their substrate.

7. The device as claimed in claim 1, wherein the follower MOS transistor is an n-channel MOS transistor.

8. The device as claimed in claim 1, furthermore comprising means for monitoring the DC voltage supply to said means for generating a reference voltage from said external DC voltage source.

9. In a programmable permanent memory, especially of EPROM type, a method for generating a voltage for programming the permanent memory from an external DC voltage source, comprising the steps of:
   generating a reference voltage from a voltage delivered by the external DC voltage source;
   duplicating the reference voltage using a current and voltage mirror structure and outputting a programming voltage; and
   stabilizing the programming voltage using a follower MOS transistor having a drain and source respectively connected to the external voltage source and an output of the current and voltage mirror structure.

10. The method as claimed in claim 9, wherein the stabilizing step includes a feedback step in which the programming voltage is slaved to said reference voltage.

11. The method as claimed in claim 10, wherein the duplicating step includes a reference voltage and current mirror operation.

12. An apparatus for generating a reference voltage, comprising:
   a generating circuit, which receives a DC voltage, generates and outputs a reference voltage;
   a duplicating circuit, which receives the reference voltage, duplicates the reference voltage and outputs the duplicated reference voltage; and
   a follower transistor having a drain coupled to the DC voltage source and a source coupled to a duplicating circuit output and a gate coupled to an internal node of the generating circuit.

13. The device as claimed in claim 8, wherein the means for monitoring the DC voltage supply comprises:
   two transistor arms, each arm including a first transistor having a gate coupled to a drain of the first transistor of the other arm and a source coupled to the DC voltage supply, and a second transistor having a gate coupled to a control signal, a source coupled to ground and a drain coupled to the drain of the respective first transistor; and
   an voltage output coupled to the drains of the first and second transistors of the second arm.

14. In a programmable permanent memory, a method for generating a voltage for programming the permanent memory from a DC voltage source, comprising the steps of:
   generating a reference voltage;
   duplicating the reference voltage, and outputting a programming voltage; and
   stabilizing the programming voltage.

15. A device for generating a voltage for programming a programmable permanent memory, especially of EPROM type, from an external DC voltage source, comprising:
   means for generating a reference voltage;
   means for receiving and duplicating said reference voltage and for outputting a programing voltage; and
   a follower MOS transistor whose drain and source are connected respectively to the external DC voltage source and to the output of said duplicating means and whose gate is connected to a predetermined internal node of said means for generating a reference voltage.

* * * * *